United States Patent [19]

Nakamura et al.

[11] Patent Number: 5,246,511
[45] Date of Patent: * Sep. 21, 1993

[54] HIGH-STRENGTH LEAD FRAME MATERIAL AND METHOD OF PRODUCING SAME

[75] Inventors: Shuichi Nakamura, Yasugi; Hakaru Sasaki, Matsue; Hironori Nakanishi, Yasugi; Tsutomu Inui, Yonago, all of Japan

[73] Assignee: Hitachi Metals, Ltd., Tokyo, Japan

[*] Notice: The portion of the term of this patent subsequent to Sep. 15, 2009 has been disclaimed.

[21] Appl. No.: 946,794

[22] Filed: Sep. 18, 1992

Related U.S. Application Data

[63] Continuation of Ser. No. 699,040, May 13, 1991, abandoned.

[30] Foreign Application Priority Data

| May 14, 1990 | [JP] | Japan | 2-123319 |
| Jul. 23, 1990 | [JP] | Japan | 2-194595 |
| Aug. 22, 1990 | [JP] | Japan | 2-220845 |
| Oct. 1, 1990 | [JP] | Japan | 2-264693 |

[51] Int. Cl.$^5$ .................................... C22C 38/08
[52] U.S. Cl. ............................. 148/621; 148/624; 148/707; 148/328; 148/336; 148/419; 148/442; 420/95
[58] Field of Search .............. 148/608, 336, 621, 624, 148/707, 328, 336, 419, 442; 420/95

[56] References Cited

U.S. PATENT DOCUMENTS

| 5,026,435 | 6/1991 | Nakamura et al. | 148/12 A |
| 5,147,470 | 9/1992 | Nakamura et al. | 148/336 |

FOREIGN PATENT DOCUMENTS

| 55-128565 | 10/1980 | Japan . |
| 55-131155 | 10/1980 | Japan . |
| 57-82455 | 5/1982 | Japan . |
| 64-817 | 11/1984 | Japan . |
| 61-006251 | 1/1986 | Japan . |
| 1-55562 | 2/1987 | Japan . |
| 64-61042 | 3/1989 | Japan . |
| 2-159351 | 6/1990 | Japan . |

*Primary Examiner*—H. Dean
*Assistant Examiner*—Sikyin Ip
*Attorney, Agent, or Firm*—Finnegan, Henderson, Farabow, Garrett & Dunner

[57] ABSTRACT

A high-strength lead frame material consists, by weight, of 0.5 to 22% Co, 22 to 32.5% Ni, not more than 1.0% Mn, not more than 0.5% Si, at least one kind of 0.1 to 3.0% in total selected from the group consisting of Nb, Ti, Zr, Mo, V, W and Be, and the balance Fe and incidental impurities; the total content of Ni and Co being selected so that the content of Ni is in the range of 27 to 32.5% when the content of Co is less than 12% and so that $66\% \leq 2Ni+Co \leq 74\%$ is met when the content of Co is not less than 12%; the lead frame material having a duplex-phase structure composed of a reverse-transformed austenite phase (which can involve a residual austenite phase) and a martensite phase; and the austenite phase being not less than 50%.

7 Claims, 2 Drawing Sheets

HIGH-STRENGTH LEAD FRAME MATERIAL AND METHOD OF PRODUCING SAME

This application is a continuation of application Ser. No. 07/699,040, filed May 13, 1991, now abandoned.

BACKGROUND OF THE INVENTION

1. Field of the Invention

This invention relates to high-strength lead frame materials for a semi-conductor device which have a higher strength than conventional ones.

2. Related Art

Recently, with higher capacity and higher integration of semi-conductors (e.g. a logic device) and also with thinner design of a packages, lead frames tend not only to have an increased number of pins, but also to be formed into a thinner strip-like configuration. Therefore, lead frame materials have now been required to have a higher strength.

Fe-42Ni alloy and Fe-29Ni-17Co alloy (KOVAR ®) are known as such a multi-pin Fe-based alloy lead frame material. Improved Fe-Ni alloy and Fe-Ni-Co alloy for such a lead frame material are disclosed in Japanese Laid-Open Patent Publication No. 55-131155, and high-strength Fe-Ni alloys incorporating various strengthening elements have also been proposed. Also, improved Fe-Ni-Co alloys are disclosed in Japanese Laid-Open Patent Publication Nos. 55-128565, 57-82455 and 56-6251, Japanese Patent Publication Nos. 1-817 and 1-15562 and Japanese Laid-Open Patent Application No. 1-61042. The last-mentioned Publication, that is, 1-61042, was earlier filed by the Applicant of the present application.

A multi-pin lead frame is produced mainly by a photo-etching method which enables fine working. However, in such thin strip-like multi-pin lead frame of Fe-42Ni alloy or Fe-29Ni-17Co alloy, the leads are liable to be warped or bent because of their inadequate strength during the assembling of the package and the transfer and mounting of the lead frame. Also, the leads may be buckled by an impact occurring during use.

With respect to improvements in Fe-Ni alloy and Fe-Ni-Co alloy, it has been disclosed to strengthen such alloys by the addition of Si, Mn and Cr (Japanese Laid-Open Patent Publication No. 55-131155) or by the addition of other strengthening elements. The thermal expansion of Fe-Ni-Co alloys is dealt with in (a) Japanese Laid-Open Patent Publication No. 55-128565, (b) Japanese Laid-Open Patent Publication No. 57-82455, (c) Japanese Laid-Open Patent Publication No. 56-6251, (d) Japanese Patent Publication No. 1-817, (e) Japanese Patent Publication No. 1-15562 and (f) Japanese Laid-Open Patent Publication No. 1-61042. However, in the former, since an excessive amount of the strengthening elements are contained in addition to the main elements, a surface oxidation is liable to occur, which results in a problem that the solderability and platability (which are main properties of the lead frame) are much deteriorated. With respect to the latter, none of publications except for (a) are intended to positively improve the strength of the lead frame. The technique disclosed in the above publication (a) is different in strengthening mechanism from the present invention.

SUMMARY OF THE INVENTION

It is therefore an object of this invention to provide a lead frame material which is highly strengthened without degrading its solderability and platability.

Another object of the invention is to provide a method of producing such a lead frame material.

The inventors of the present invention have directed attention to Fe-Ni-Co alloy whose austenitic phase is metastable at room temperature, and has conducted various tests with respect to compositions and production conditions thereof. As a result, the inventors have found that the alloy can be highly strengthened without adversely affecting various properties (particularly, the solderability and platability) by a method in which a work-induced martensite transformation is produced at a specified working ratio, and subsequently a reverse-transformed austenite phase is precipitated by annealing, thereby providing a duplex structure of a specified phase ratio. Based on this fact, the inventors made the basic invention.

Namely, the most important feature of the material of the above basic invention is that the composite structure composed of the austenitic phase and the martensitic phase is provided without the addition of those strengthening elements adversely affecting the solderability and platability whereas in the conventional Fe-Ni-Co alloys, the austenite single phase is highly strengthened by the addition of strengthening elements FIGS. 2A and 2B are photographs of typical micro structures of the materials of the present invention, as compared with that of Kovar (conventional material) shown in FIG. 2C. As will be appreciated from these photographs, the conventional kovar alloy has the austenite single phase structure whereas the alloys of the present invention have the composite structure composed of the austenite phase including reverse-transformed austenite, or γR (residual austenite) and γ" martensite). With this structure, the alloys of the present invention have a high strength.

However, the reverse transformation from the martensite phase to the austenite phase in the material of the above basic invention is very sensitive to temperature, and therefore the dependency of the strength on the annealing temperature is high, and this is somewhat undesirable from the viewpoint of a stable production. Therefore, the inventors of the present invention have found that by utilizing the reverse transformation from the martensite phase to the austenite phase and also by utilizing a solid-solution strengthening or a precipitation strengthening, the alloy can be highly strengthened with the annealing temperature dependency lowered, without adversely affecting its solderability and thermal expansion characteristics.

On the other hand, with respect to Fe-Ni-Co alloys with which the present invention deals, it has been found that their high-temperature ductility can be greatly improved by the addition of at least one kind of additive of 0.0001 to 0.03% in total selected from the group consisting of B, Mg and Ca. Namely, by the addition of a small amount of at least one of B, Mg and Ca, a large size of steel ingot can be easily hot worked into a desired shape, and a thin material such as a lead frame material (to which the present invention is directed) can be obtained with a good yield.

More specifically, according to the present invention, there is provided a high-strength lead frame material consisting, by weight, of 0.5 to 22% Co, 22 to 32.5% Ni, not more than 1.0% Mn, not more than 0.5% Si, at least one kind of additive of 0.0001 to 0.03% in total selected from the first group consisting B, Mg and Ca, or at least one kind of additive of 0.1 to 3.0% in total selected from the second group consisting of Nb, Ti, Zr, Mo, V, W and Be, or at least two kinds of additive selected from both the first and second groups, and the balance Fe and incidental impurities; the total content of Ni and Co being selected so that the content of Ni is in the range of 27 to 32.5% when the content of Co is less than 12% and so that $66\% \leqq 2Ni + Co \leqq 74\%$ is met when the content of Co is not less than 12%; the lead frame material having a duplex-phase structure composed of a reverse-transformed austenite phase (which may involve a residual austenite phase) and a martensite phase; and the austenite phase being not less than 50%.

According to another aspect of the invention, there is provided a method of producing a high-strength lead frame material which comprises the steps of subjecting the alloy of the above composition to a solution heat treatment at a temperature not lower than the temperature at which the austenitizing is finished; subsequently transforming part of the austenite phase of the alloy into a work-induced martensite by cold working at a working ratio of 40 to 90%; and subsequently annealing the alloy at a temperature lower than the above austenitizing-finished temperature to thereby precipitate the reverse-transformed austenite phase.

In the material of the present invention, 0.5 to 3% of Ni may be replaced by an equal amount of Cu, by which a gap corrosion resistance can be enhanced.

The reasons for the limitation of numerical values in the present invention will now be described.

When the Co content is about 17% or about 5%, the thermal expansion coefficient is optimally minimized. If this content is less than 0.5% or more than 22%, the thermal expansion coefficient is increased, so that the thermal expansion compatibility with a silicone chip is deteriorated. Therefore, the Co content is limited to the range of 0.5 to 22%.

The Ni content is determined in connection with the Co content. If the Ni content is less than 27% with the Co content being less than 12%, or if the content (2Ni+Co) is less than 66% with the Co content being not less than 12%, the martensite transformation-starting temperature is high, and the austenite becomes unstable, and is subjected to the martensite transformation during the cooling step of the solution heat treatment, so that a sufficient amount of the austenite cannot be obtained. Also, if the Ni content exceeds 32.5% with the Co content being less than 12%, or if the content (2Ni+Co) exceeds 74% with the Co content being not less than 12%, the austenite phase becomes too stable at room temperature, so that the work-induced transformation can not easily occur. Therefore, it is decided that the Ni content is 27 to 32.5% when the Co content is less than 12%, and that $66\% \leqq 2Ni + Co \leqq 74\%$ is satisfied when the Co content is not less than 12%.

Mn serves as a deoxidizing agent, but if its content exceeds 1.0%, it increases the thermal expansion coefficient, and also deteriorates the solderability and the platability. Therefore, this content is limited to not more than 1.0%. A preferred content of Mn is not more than 0.6%, as later described.

Si is added as a deoxidizing agent, and it is preferred that no residual Si should be present in the material. However, up to 0.5% of Si will not cause an extreme increase of the thermal expansion coefficient and an extreme deterioration of the solderability and platability, and therefore this amount is allowable. A preferred content of Si is not more than 0.3% as later described.

Nb, Ti, Zr, Mo, V, W and Be are important elements for strengthening the base structure by the solid-solution strengthening or the precipitation strengthening of the alloy of the present invention. The alloy of the present invention is strengthened by the precipitation of the reverse-transformed austenite phase during the final annealing. A larger amount of the austenite is preferred from the viewpoint of the thermal expansion characteristics, and therefore it is necessary that the final annealing temperature should be as high as possible. However, as indicated by a solid line in FIG. 1, with respect to Fe-Ni-Co alloy, its mechanical characteristics or properties abruptly are lowered with the increase of the annealing temperature. Therefore, it is preferred from the viewpoint of a stable production that the dependency of the mechanical characteristics on the annealing temperature should be lowered.

The present invention is based on the findings that by the addition of the solid-solution strengthening or precipitation strengthening elements, the dependency of the mechanical characteristics on the annealing temperature can be lowered, and that the characteristics at the high-temperature side can be greatly improved, as indicated in a dotted-line in FIG. 1.

If the amount of addition of these strengthening elements is less than 0.1%, there is no stabilizing effect, and in contrast if this amount exceeds 3%, the surface oxidation is promoted, thereby adversely affecting the solderability and the platability. These elements act to bring about austenite, and therefore if the amount of addition thereof is increased, the austenite of the base structure becomes too stable. Therefore, the amount of addition of these elements is limited to 0.1 to 3%.

B and Mg are added in order to enhance the hot workability. If the total amount of addition of one or both is less than 0.0001%, the effect achieved is not satisfactory. In contrast, if this amount exceeds 0.03%, the ductility during the cold working is lowered, and also the etching ability of the material is deteriorated. Therefore, this amount is limited to 0.0001 to 0.03%, and is preferably not more than 0.01%.

Further, in the material of the present invention, it has been found through tests for evaluation of the solderability and coating ability that when the residual Mn and Si (which are added as deoxidizing agents) as well as the impurities (such as carbon, sulfur, oxygen and nitrogen) are limited to less than respective specified values, the solderability and the platability are further improved, thus improving other desired practical characteristics in addition to the strength and the thermal expansion coefficient. Referring to these specified values, Mn is not more than 0.6%, Si is not more than 0.3%, C is not more than 0.02%, S is not more than 0.015%, 0 is not more than 150 ppm, and N is not more than 150 ppm.

The final structure is determined by the residual austenite phase at the solution heat treatment step, the work-induced martensite phase, and the reverse-transformed austenite phase precipitated at the final annealing step. If the residual and reverse-transformed austenite is less than 50%, the thermal expansion coefficient is high, so that the thermal expansion compatibility with the silicon chip is deteriorated. If the austenite phase is 100%, the strength of the base structure is extremely lowered. For these reasons, it is decided that the structure is composed of the two phases (duplex-phase), that is, the austenite phase (which is composed of the residual austenite and the reverse-transformed austenite) and the martensite phase, and that the total amount of the above austenite phase is limited to not less than 50%.

In the present invention, the amount (%) of the austenite phase is values determined by X-ray diffraction intensity mentioned below in examples of the invention.

Next, in the method of producing the material of the present invention, if the solution heat treatment before the cold working is carried out at a temperature lower than the austenitizing-finished temperature, the amount of the austenite phase is not sufficient. Therefore, the solution heat treatment temperature should be not less than the austenitizing-finished temperature. However, since the crystal grains need to be made very fine at the next step, this solution heat treatment temperature should more preferably be not more than 950° C.

If the cold working ratio is less than 40%, the work-induced martensite transformation does not occur in a sufficient rate. In contrast, if the cold working ratio exceeds 90%, the anisotropy of the material is increased. For these reasons, this cold working rate is limited to 40 to 90%.

If the final annealing temperature exceeds the austenitizing-finished temperature, all the work-induced martensite phase is transformed into the reverse-transformed austenite, so that the desired precipitating strength due to the duplex-phase structure is not obtained. Therefore, the final annealing temperature is limited to the temperature lower than the austenitizing-finished temperature.

With respect to $\alpha_{R.T\text{-}300}$ (the average thermal expansion coefficient in a range of from room temperature to 300° C.), the hardness and the tensile strength, it has been judged, after studying the package assembling process and the environment in which the lead frame is used, that $\alpha_{R.T\text{-}300}$ can be sufficiently durably used for $(3\sim9)\times10^{-6}/°$ C., a hardness of $Hv \geq 260$ and a tensile strength of not less than 80 kgf/mm².

DESCRIPTION OF THE INVENTION

Figure 1:
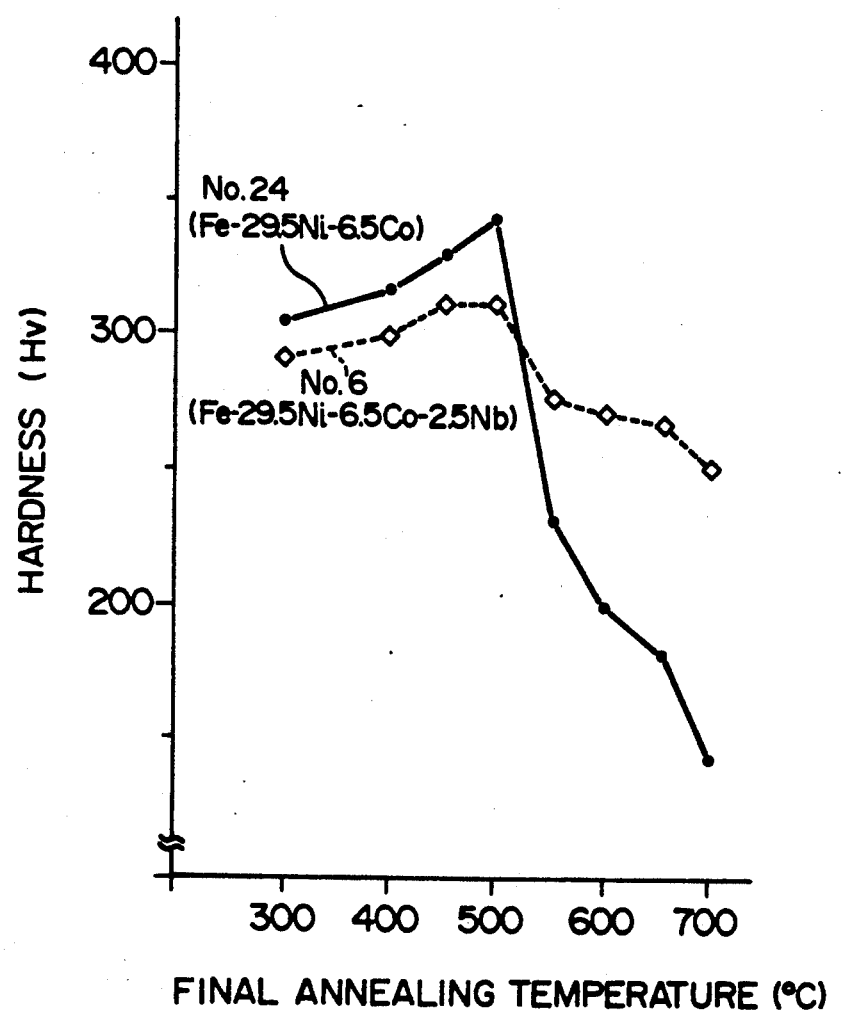
FIG. 1 is a graph showing the relation between the final annealing temperature and the mechanical characteristics with respect to each of materials with and without Nb.
Figure 2A:
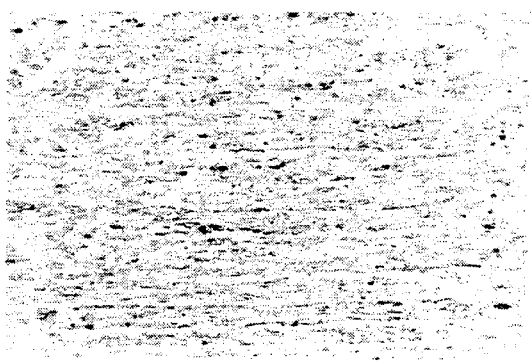
FIGS. 2A, 2B and 2C are photographs showing structures of materials.
Figure 2B:
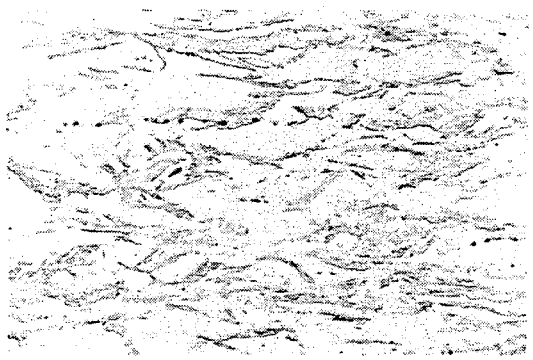
Figure 2C:
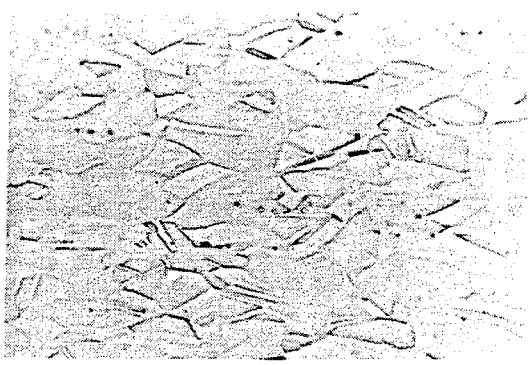

Materials according to the present invention will now be described by way of examples. Each of alloys of various compositions shown in Table 1 was melted in a vacuum induction melting furnace; was cast; was forged at temperature of 1100° to 1150° C.; and then was hot-rolled into a thickness of 3 mm; and then was subjected to a solution heat treatment at 950° C. for one hour; and then was cold-rolled into a thickness of 0.35 mm.

Each of the above materials having a thickness of 0.35 mm was subjected to a solution heat treatment at 750° C., then was cold-rolled into a thickness of 0.1 mm (working ratio: 71%), and then was subjected to the final annealing at temperature of 500° to 650° C. Various properties of each of these material subjected to these sequential treatments are shown in Table 2. Alloy No. 30' was obtained by finishing material No. 30 (having a thickness of 0.35 mm) to a thickness of 0.1 mm according to its standard production process.

The amount (%) of the austenite phase was determined in the following manner:

$$\text{Austenite phase (\%)} = \frac{I\gamma}{I\gamma + I\alpha} \times 100$$

$I\gamma = I\gamma(111) + I\gamma(200) + I\gamma(220) + I\gamma(311) + I\gamma(222)$ where $I\gamma(111)$ and so on are X-ray diffraction intensity of the austenite.

$I\alpha = I\alpha(110) + I\alpha(200) + I\alpha(211)$ where $I\alpha(110)$ and so on are X-ray diffraction intensity of the martensite.

TABLE 1

| Alloy No. | \multicolumn{10}{c}{Chemical composition (wt. %)} | | | | | | | | | | 2Ni + Co | Fe |
|---|---|---|---|---|---|---|---|---|---|---|---|---|
| | C | Si | Mn | B | Mg | Ca | Cu | Ni | Co | others | 2Ni + Co | Fe |
| 1 | 0.008 | 0.11 | 0.50 | — | — | — | 1.1 | 27.13 | 18.91 | Ti = 1.2 | 73.17 | Bal |
| 2 | 0.007 | 0.15 | 0.49 | — | — | — | — | 28.12 | 16.44 | Zi - 2.1 | 72.68 | " |
| 3 | 0.008 | 0.12 | 0.51 | — | — | — | — | 28.85 | 10.96 | Mo = 1.8 | — | " |
| 4 | 0.006 | 0.11 | 0.50 | — | — | — | — | 29.44 | 6.48 | Nb = 0.8 | — | " |
| 5 | 0.007 | 0.11 | 0.49 | — | — | — | — | 29.51 | 6.51 | Nb = 1.3 | — | " |
| 6 | 0.006 | 0.11 | 0.51 | 0.0103 | — | — | — | 29.30 | 6.46 | Nb = 2.5 | — | " |
| 7 | 0.009 | 0.11 | 0.47 | 0.0045 | — | — | 0.06 | 28.55 | 2.44 | V = 2.1 | — | " |
| 8 | 0.004 | 0.12 | 0.50 | 0.0006 | — | — | — | 28.27 | 16.55 | N = 1.5 | 73.09 | " |
| 9 | 0.006 | 0.12 | 0.49 | 0.0017 | — | — | — | 27.43 | 2.39 | Be = 0.31 | — | " |
| 10 | 0.006 | 0.12 | 0.49 | 0.0055 | — | — | — | 29.52 | 5.47 | Be = 0.45 | — | " |
| 11 | 0.009 | 0.12 | 0.49 | 0.0121 | — | — | — | 29.98 | 4.41 | Be = 0.55 | — | " |
| 12 | 0.008 | 0.10 | 0.48 | 0.0033 | — | — | — | 28.11 | 16.48 | Ti = 0.47  Zr = 0.32 | 72.70 | " |
| 13 | 0.008 | 0.12 | 0.50 | 0.0029 | — | — | — | 29.51 | 6.54 | — | — | " |
| 14 | 0.010 | 0.11 | 0.49 | 0.0025 | — | 0.0012 | — | 28.49 | 6.49 | — | — | " |
| 15 | 0.008 | 0.11 | 0.49 | 0.0270 | — | 0.0056 | — | 31.05 | 4.51 | — | — | Bal |
| 16 | 0.009 | 0.11 | 0.51 | — | 0.0006 | — | — | 26.99 | 18.87 | Ti = 1.3 | 72.85 | " |
| 17 | 0.009 | 0.12 | 0.50 | — | — | 0.0037 | — | 29.53 | 6.47 | Nb = 0.9 | — | " |
| 18 | 0.010 | 0.10 | 0.49 | — | 0.0061 | — | 0.4 | 29.42 | 6.55 | Nb = 2.5 | — | " |
| 19 | 0.006 | 0.12 | 0.50 | | 0.0131 | 0.0022 | — | 28.12 | 16.46 | Ti = 0.51  Nb = 0.53 | 72.70 | " |
| 20 | 0.007 | 0.11 | 0.50 | — | 0.0267 | — | — | 31.19 | 4.50 | Be = 0.35 | — | " |
| 21 | 0.009 | 0.12 | 0.50 | 0.0024 | 0.0030 | 0.0018 | — | 29.55 | 6.57 | Nb = 1.2 | — | " |
| 22 | 0.008 | 0.11 | 0.50 | 0.0055 | 0.0083 | — | 0.3 | 29.48 | 6.53 | Ti = 0.46  Nb = 0.52 | — | " |
| 23 | 0.009 | 0.11 | 0.49 | 0.0130 | 0.0115 | — | — | 27.48 | 2.52 | Be = 0.23 | — | " |
| 24 | 0.010 | 0.11 | 0.49 | 0.0028 | — | — | — | 29.48 | 6.51 | — | — | " |

TABLE 1-continued

| Alloy No. | Chemical composition (wt. %) | | | | | | | | | | 2Ni + Co | Fe |
|---|---|---|---|---|---|---|---|---|---|---|---|---|
| | C | Si | Mn | B | Mg | Ca | Cu | Ni | Co | others | | |
| 25 | 0.011 | 0.12 | 0.50 | 0.0353 | — | — | — | 30.01 | 6.59 | Nb = 1.2 | — | " |
| 26 | 0.008 | 0.12 | 0.50 | — | 0.0395 | — | — | 29.56 | 6.57 | Nb = 1.1 | — | " |
| 27 | 0.011 | 0.13 | 0.48 | 0.0274 | 0.0228 | — | — | 29.97 | 6.50 | Nb = 1.2 | — | " |
| 28 | 0.012 | 0.12 | 0.48 | — | — | — | — | 29.85 | 5.87 | Nb = 1.2 | — | " |
| 29 | 0.010 | 0.11 | 0.50 | — | — | — | — | 31.31 | 6.33 | Be = 0.61 | — | " |
| 30 | 0.010 | 0.11 | 0.49 | — | — | — | — | 28.94 | 16.92 | — | 74.80 | " |
| 30' | " | " | " | " | " | " | " | " | " | " | " | " |

TABLE 2

| Alloy No. | Austenite Amount (%) | Hardness (NV) | Tensile strength kgf/mm² | αRT-300 (×10⁻⁶/°C.) | Solderability | Platability | Etching ability | Hot workability | P.I.: present invention Com: comparative example |
|---|---|---|---|---|---|---|---|---|---|
| 1 | 79 | 381 | 118 | 8.6 | no bulge | no separation | good | good | P.I. |
| 2 | 94 | 269 | 83 | 5.0 | " | " | " | " | " |
| 3 | 84 | 298 | 102 | 7.4 | " | " | " | " | " |
| 4 | 94 | 293 | 95 | 6.7 | " | " | " | " | " |
| 5 | 89 | 313 | 103 | 7.5 | " | " | " | " | " |
| 6 | 92 | 302 | 103 | 6.8 | " | " | " | Excellent | " |
| 7 | 89 | 273 | 91 | 7.4 | " | " | " | " | " |
| 8 | 91 | 275 | 89 | 5.5 | " | " | " | " | " |
| 9 | 89 | 273 | 87 | 7.9 | " | " | " | " | " |
| 10 | 91 | 285 | 97 | 7.6 | " | " | " | " | " |
| 11 | 93 | 297 | 102 | 7.3 | " | " | " | " | " |
| 12 | 91 | 265 | 81 | 4.8 | " | " | " | " | " |
| 13 | 93 | 287 | 96 | 6.5 | " | " | " | " | " |
| 14 | 84 | 315 | 107 | 7.6 | no bulge | no separation | good | Excellent | P.I. |
| 15 | 90 | 297 | 94 | 7.1 | " | " | " | " | " |
| 16 | 80 | 381 | 115 | 8.7 | " | " | " | " | " |
| 17 | 92 | 301 | 99 | 7.1 | " | " | " | " | " |
| 18 | 91 | 307 | 104 | 7.7 | " | " | " | " | " |
| 19 | 89 | 273 | 94 | 5.0 | " | " | " | " | " |
| 20 | 93 | 297 | 102 | 7.1 | " | " | " | " | " |
| 21 | 89 | 311 | 107 | 7.3 | " | " | " | " | " |
| 22 | 83 | 219 | 112 | 7.8 | " | " | " | " | " |
| 23 | 89 | 277 | 88 | 7.8 | " | " | " | " | " |
| 24 | 93 | 310 | 105 | 6.9 | " | " | " | " | " |
| 25 | 89 | 305 | 100 | 7.8 | " | " | Poor etching rate | " | Com |
| 26 | 90 | 311 | 103 | 7.1 | " | " | " | " | " |
| 27 | 91 | 302 | 99 | 7.0 | " | " | " | " | " |
| 28 | 95 | 305 | 99 | 6.7 | " | " | good | good | P.I. |
| 29 | 94 | 291 | 90 | 6.9 | " | " | " | " | " |
| 30 | 100 | 217 | 67 | 4.5 | " | " | " | Excellent | Conventional alloy |
| 30' | 100 | 210 | 67 | 4.8 | " | " | " | " | " |

Materials (alloys) Nos. 1 to 24 of the present invention have the mixed-phase structure composed of the austenite phase and the above-mentioned martensite phase, and it will be appreciated from Table 2 that these materials of the present invention exhibit far higher mechanical properties or characteristics (i.e., Hv≧260; tensile strength≧80 kgf/mm²) than those of the conventional materials No. 30 and 30' composed of a single phase of austenite (the austenite amount: 100%). With respect to material No. 24 containing no solid-solution strengthening or precipitation strengthening element, the hardness is abruptly lowered when it is heated at temperatures of above 500° C., as shown in FIG. 1. Though alloy Nos. 1 to 23 of the present invention were highly strengthened, they had no problem with the solderability, the platability and the etching ability, and exhibited good such properties. Although material Nos. 1 to 5, 28 and 29 of the present invention were subjected to slight cracking during the hot working because they did not contain any of B, Mg and Ca, their workability was good, and therefore it will be appreciated that their productivity can be improved by the addition of a proper amount of one or more of B, Mg and Ca. However, it will be appreciated from comparative material Nos. 25, 26 and 27 that the addition of an excessive amount of one or both of B and Mg will adversely affect the etching ability.

FIG. 1 is a graph showing the relation between the hardness and the final annealing temperature with respect to the alloy with Nb (the solid-solution strengthening or precipitation strengthening element) and the alloy without Nb.

As will be appreciated from FIG. 1, both of the alloys have the peak of the hardness at the final annealing temperature of about 500° C. The alloy without Nb is higher in the hardness peak than the alloy with Nb, but is abruptly decreased in hardness with the increase of the final annealing temperature, and therefore has a higher dependency on the annealing temperature. On the other hand, the alloy containing 2.5% Nb has a lower dependency on the annealing temperature, and exhibits better mechanical properties at higher temperatures of over 520° to 530° C. than the alloy containing no Nb.

As described above, in the present invention, in the specified composition of the Fe-Ni-Co type alloy, the martensite transformation caused by the work-induction at the final cold-rolling step is combined with the precipitation of the reverse-transformed austenite at the final annealing step, and further the strength at the higher temperature side is made stable by the solid-solution strengthening. With this method, the high strength necessary for the multi-pin, thin plate-type lead frame is obtained, and also the dependency of the strength on the annealing temperature is reduced, and the hot workability is enhanced. Therefore, the lead frame materials of the present invention have quite excellent effects from an industrial point of view.

What is claimed is:

1. A high-strength lead frame material consisting, by weight, of:
    0.5 to 22% Co; 22 to 32.5% Ni; not more than 1.0% Mn; not more than 0.5% Si; at least one material in an amount of 0.1 to 3.0% in total selected from the group of materials consisting of Nb, Ti, Zr, Mo, V, W and Be; and the balance Fe and incidental impurities,
    wherein the total content of Ni and Co is selected so that the content of Ni is in the range of 27 to 32.5% when the content of Co is less than 12% and so that the relationship 66%<2Ni+Co<74% is met when the content of Co is not less than 12%, and wherein said lead frame material consists of: 50% to 95% first phase of austenite selected from the group consisting of reverse transformed austenite phase, and a mixture of reverse transformed austenite phase and residual austenite phase; and a balance second phase of substantially martensite phase.

2. A high-strength lead frame material consisting, by weight, of:
    0.5 to 22% Co; 22 to 32.5% Ni; not more than 1.0% Mn; not more than 0.5% Si; at least one material in an amount of 0.0001 to 0.03% in total selected from the group of materials consisting of B, Mg and Ca; and the balance Fe and incidental impurities,
    wherein the total content of Ni and Co is selected so that the content of Ni is in the range of 27 to 32.5% when the content of Co is less than 12% and so that the relationship of 66%<2Ni+Co<74% is met when the content of Co is not less than 12%, and wherein said lead frame material consists of: 50% to 95% first phase of austenite selected from the group consisting of reverse transformed austenite phase, and a mixture of reverse transformed austenite phase and residual austenite phase; and a balance second phase of substantially martensite phase.

3. A high-strength lead frame material consisting, by weight, of:
    0.5 to 22% Co; 22 to 32.5% Ni; not more than 1.0% Mn; not more than 0.5% Si; at least one material in an amount of 0.0001 to 0.03% in total selected from the group of materials consisting of B, Mg and Ca; at least one material in the amount of 0.1 to 3.0% in total selected from the group of materials consisting of Nb, Ti, Zr, Mo, V, W and Be; and the balance Fe and incidental impurities,
    wherein the total content of Ni and Co is selected so that the content of Ni is in the range of 27 to 32.5% when the content of Co is less than 12% and so that the relationship of 66%<2Ni+Co<74% is met when the content of Co is not less than 12% and wherein said lead frame material consists of: 50% to 95% first phase of austenite selected from the group consisting of reverse transformed austenite phase, and a mixture of reverse transformed austenite phase and residual austenite phase; and a balance second phase of substantially martensite phase.

4. A high-strength lead frame material according to any one of claims 1 to 3, wherein 0.5 to 3.0% of said Ni is replaced by an equal amount of Cu.

5. A high-strength lead frame material according to claim 1 or claim 2, wherein the lead frame material has an average thermal expansion coefficient in a range of from room temperature to 300° C. of from $3 \times 10^{-6}/°$ C. to $9 \times 10^{-6}/°$ C., a hardness (Hv) not less than 260, and a tensile strength not less than 80 kgf/mm$^2$.

6. A method of producing a high-strength lead frame material, the method comprising the steps of:
    subjecting an alloy having the composition claimed in claim 1 to a solution heat treatment at a temperature not lower than a temperature at which the austenitizing is finished;
    subsequently transforming part of an austenite phase of said alloy into a work-induced martensite by cold working at a working ratio of 40 to 90%; and
    subsequently annealing said alloy at a temperature which is lower than said austenitizing-finished temperature and greater than or equal to approximately 300° C. to thereby precipitate a reverse-transformed austenite phase.

7. The method of claim 6, wherein the annealing step is performed at a temperature greater than or equal to approximately 500° C.

* * * * *

UNITED STATES PATENT AND TRADEMARK OFFICE
CERTIFICATE OF CORRECTION

PATENT NO. : 5,246,511
DATED : September 21, 1993
INVENTOR(S) : Shuichi NAKAMURA et al.

It is certified that error appears in the above-indentified patent and that said Letters Patent is hereby corrected as shown below:

In claim 1, column 9, line 21, at two occurrences, change "<" to --$\leq$--.

In claim 2, column 9, line 41, at two occurrences, change "<" to --$\leq$--.

In claim 3, column 10, line 14, at two occurrences, change "<" to --$\leq$--.

Signed and Sealed this

Twenty-fourth Day of May, 1994

Attest:

BRUCE LEHMAN

*Attesting Officer*     *Commissioner of Patents and Trademarks*